(12) United States Patent
Matsuo et al.

(10) Patent No.: US 7,687,323 B2
(45) Date of Patent: Mar. 30, 2010

(54) SURFACE-ROUGHENING METHOD

(75) Inventors: Tetsuji Matsuo, Saitama (JP); Mikio Tazima, Saitama (JP); Takashi Kato, Saitama (JP)

(73) Assignee: Sanken Electric Co., Ltd. (JP)

( * ) Notice: Subject to any disclaimer, the term of this patent is extended or adjusted under 35 U.S.C. 154(b) by 0 days.

(21) Appl. No.: 12/104,097

(22) Filed: Apr. 16, 2008

(65) Prior Publication Data

US 2008/0261340 A1    Oct. 23, 2008

(30) Foreign Application Priority Data

Apr. 18, 2007   (JP) ............................... 2007-109272

(51) Int. Cl.
*H01L 21/20* (2006.01)
(52) U.S. Cl. .................... 438/141; 438/606; 438/91; 257/E21.17; 257/E21.126; 257/E21.245; 257/E21.346; 257/E21.352
(58) Field of Classification Search ................ 438/141, 438/91, 93, 94, 222, 311, 606, 680, 687, 438/688, 681, 706
See application file for complete search history.

(56) References Cited

U.S. PATENT DOCUMENTS

| | | | | |
|---|---|---|---|---|
| 7,180,108 | B2 * | 2/2007 | Kawase et al. | 257/288 |
| 7,361,927 | B2 * | 4/2008 | Kawase et al. | 257/40 |
| 7,425,474 | B2 * | 9/2008 | Kawase et al. | 438/151 |
| 2008/0315232 | A1 * | 12/2008 | Matsuo et al. | 257/98 |
| 2009/0008142 | A1 * | 1/2009 | Shimizu et al. | 174/261 |

FOREIGN PATENT DOCUMENTS

JP     2003209283    7/2003

* cited by examiner

*Primary Examiner*—David Nhu
(74) *Attorney, Agent, or Firm*—Woodcock Washburn LLP

(57) ABSTRACT

The method is disclosed as applied to roughening the light-emitting surface of an LED wafer for reduction of the internal total reflection of the light generated. A masking film of silver is first deposited on the surface of a wafer to be diced into LED chips. Then the masking film is heated to cause its coagulation into discrete particles. Then, using the silver particles as a mask, the wafer surface is dry etched to create pits therein. The deposition of silver on the wafer surface and its thermal coagulation into particles may be either successive or concurrent.

8 Claims, 4 Drawing Sheets

SURFACE-ROUGHENING METHOD

CROSS REFERENCE TO RELATED APPLICATIONS

This application claims priority to Japanese Patent Application No. 2007-109272, filed Apr. 18, 2007.

BACKGROUND OF THE INVENTION

This invention relates to a method of roughening solid surfaces, that is, creating a multiplicity of closely spaced pits and projections on or in such surfaces. The invention lends itself to the surface roughening of light-emitting semiconductor devices, or light-emitting diodes (LEDs) in more common parlance, for reduction of internal total reflection of the light, and of semiconductor substrates for epitaxial growth of low-dislocation-density layers thereon, among other applications.

An LED may be envisaged for the purposes of the invention as a combination of a light-generating chip of semiconducting material and a protective envelope of transparent plastic material therefor. The semiconductor chip of familiar design has a set of layers for generating light, and a supplementary layer (termed variously as a current-spreading layer, contact layer, etc.) that has a surface from which there is emitted the light radiating from the light-generating layers. Issuing from the surface of the supplementary layer, the light has to traverse the protective envelope.

As is well known, total internal reflection occurs at the boundary surface between two dissimilar materials when the light strikes the surface at an angle greater than the critical angle which is determined by the refractive indices of the materials in question. The noted supplementary layer of the semiconductor chip has a refractive index of 3.1-3.5 whereas the protective envelope has that of 1.5 or so. The critical angle in this case is 25-29 degrees. Those of the light rays radiated in various directions in the semiconductor chip which impinge on the boundary surface at angles greater than the critical angle with respect to the normal to the surface are totally reflected away therefrom, with a consequent drop in the efficiency of the LED.

A remedy, itself well known in the art, to the undesired total internal reflection of LEDs is the roughening of the light-emitting surface of the chip, as disclosed for example in Japanese Unexamined Patent Publication No. 2003-209283. It teaches to roughen the chip surface by blade machining or by photolithography using a photomask and photoresist. Blade machining is objectionable by reason of tools and associated equipment required. Photolithography on the other hand demands the fabrication of a finely patterned photomask, and it is extremely difficult, and costly too, to unerringly create surface unevenness in the order of tens or hundreds of nanometers.

Another possible application of the invention may now be briefly explained by way of reconfirmation of the utility of the surface-roughening method according to the invention. The method lends itself to use in the fabrication of dislocation-free semiconductor layers by what is known as microchannel epitaxy (MCE). The MCE is such that a semiconductor crystal is grown by epitaxy on a semiconductor surface which has been previously roughened with pits. The crystal grows not only upwardly but laterally of the semiconductor surface, totally filling the pits in the semiconductor surface. There is thus obtained a flat-surfaced, dislocation-free crystal layer. The roughening of the semiconductor surface preliminary to MCE has encountered the same difficulties as with LEDs discussed above.

SUMMARY OF THE INVENTION

The present invention has it as an object to roughen desired work surfaces more easily and inexpensively than heretofore.

Briefly, the invention may be summarized as a particulate-mask surface-roughening method, which starts with the provision of work such as an LED wafer having a surface to be roughened, the work being of a material capable of etching with a prescribed etchant such as etching gas or etching liquid. On this work surface there is formed a masking film of a material such as silver capable of thermal coagulation into particulate or granular form and of resisting the prescribed etchant. The masking film is heated for coagulation into a particulate mask on the work surface. Then the work surface is roughened by etching with the prescribed etchant through the particulate mask.

The creation of the masking film on the work surface and the thermal coagulation of this film into a particulate mask need not be successive but concurrent, all that is required being that the work surface be covered with the particulate mask. Thus the masking material being deposited on the work surface while being heated to a temperature sufficient for it to coagulate into particles. Thereafter, as in foregoing summary, the work surface may be etched through the thus-formed particulate mask.

In some applications of the invention, depending upon the composition of the work having the surface to be roughened, silver or other mask material to form the particulate mask will not easily coagulate into discrete particles on the work surface. In such cases, instead of forming the masking film or particulate mask directly on the work surface, what is herein termed a coagulation accelerator film may first be formed on the work surface. The coagulation accelerator film should be of a material (e.g., silicon oxide) that at least allows fairly easy coagulation of a preselected mask material into particulate form and that is etchable with an etchant resisted by the mask material.

The coagulation accelerator film is first formed on the work surface to be roughened. Then the preselected mask material may be filmed on the coagulation accelerator film and heated for coagulation into a particulate mask, here again either successively or concurrently. Then the coagulation accelerator film may be etched through the particulate mask using the etchant that does not attack the mask. Upon subsequent removal of the particulate mask, there are left on the work surface only island-like remnants of the coagulation accelerator film which have been masked. These island-like remnants of the coagulation accelerator film serve to roughen the work surface. The roughening of the work surface may now be considered finished.

Some additional steps are needed, however, for roughening the work surface in exactly the same sense as in the foregoing brief summary of the invention. This objective requires that the work be etchable with a second prescribed etchant which the coagulation accelerator film resists. The additional steps include etching the work surface with the second prescribed etchant using the island-like remnants of the coagulation accelerator film as mask. Then the island-like remnants of the coagulation accelerator film is removed from over the work surface. Since the island-like remnants of the coagulation accelerator film have been formed in strict conformity with the pattern of the particulate mask, the work surface has now pits defined therein as if they were etched through the particulate mask.

A most pronounced feature of the particulate-mask surface-roughening method according to the invention is that it does away with photolithography for etching the work surface. The surface roughening of LED wafers or like has thus been rendered far less costly and time-consuming than heretofore.

The above and other objects, features and advantages of this invention will become more apparent, and the invention itself will best be understood, from a study of the following description and appended claims, with reference had to the attached drawings showing some preferable modes of implementing the invention.

DETAILED DESCRIPTION

Figure 1:
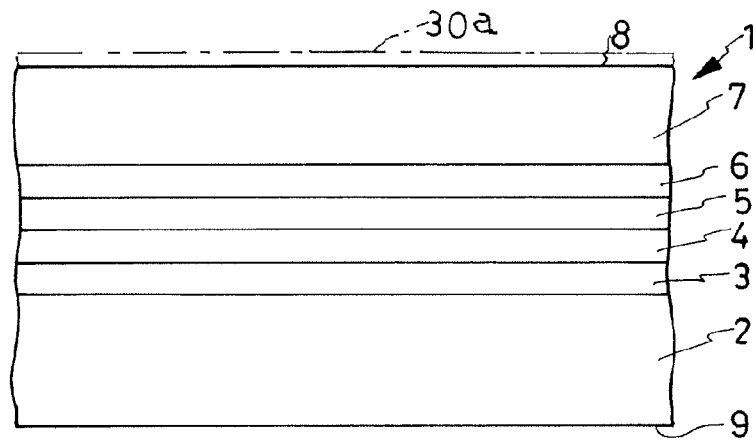
FIG. 1 is a sectional illustration of a double heterojunction LED wafer having a surface to be roughed by the method of this invention.

The particulate mask surface-roughening method according to the present invention will now be described more specifically as applied by way of example to an LED wafer of known double heterojunction design, which is to be subsequently diced into LED chips or dies. As pictured in FIG. 1, the exemplified double heterojunction LED wafer 1 has a substrate 2 on which there are successively grown a buffer 3, an n-type semiconductor layer or lower cladding 4, an active layer 5, a p-type semiconductor layer or upper cladding 6, and a supplementary layer 7.

The substrate 2 is of silicon doped with either n- or p-type impurity to possess electric conductivity. Alternatively, the substrate 2 may be made from any such known or suitable materials as sapphire, ceramics, or semiconductors other than silicon.

The buffer 3 is multilayered, having multiple alternations of an aluminum nitride and a gallium nitride layer grown by epitaxy. A monolayered buffer is adoptable instead. It is even possible to do without any such buffer.

Formed on the substrate 2 via the buffer 3 is the light-generating semiconductor region which in this embodiment comprises the n-type lower cladding 4, active layer 5, and p-type upper cladding 6 to provide the double heterojunction LED. The lower cladding 4 is formed directly on the buffer 3 by epitaxial growth of an n-type nitride semiconductor such as gallium nitride.

The active layer 5 is formed on the lower cladding 4 by epitaxial growth of undoped nitride semiconductor such as indium gallium nitride. The active layer 5 may either take the form of the known multiple quantum well structure, which is preferred, or be of the same composition throughout. However, the provision of this active layer is not an absolute necessity; indeed, it might be eliminated, and the two semiconductor layers 4 and 6 of opposite conductivity types placed against each other.

The upper cladding 6 is formed in this embodiment on the active layer 5 by epitaxial growth of a p-type nitride semiconductor such as gallium nitride.

The supplementary layer 7, which may be also termed a current spreading layer or ohmic contact layer depending upon the primary function for which it is intended, is formed on the upper cladding 6 by epitaxial growth of a p-type nitride semiconductor such as gallium nitride. The p-type dopant concentration of this supplementary semiconductor layer 7 is higher than that of the p-type upper cladding 6.

With the wafer 1 being configured as above described with reference to FIG. 1, the light generated at the active layer 5 is to be emitted from one major surface 8 of the wafer. This surface 8 of the wafer 1, or of its supplementary layer 7, will therefore be hereinafter referred to as the light-emitting surface. The anode, not shown in this figure, of each LED is to be formed on this light-emitting surface, and the cathode, also not shown here, on the other major surface 9 of the wafer 1 or on the back or underside of the substrate 2.

The wafer 1 is conventionally diced into individual chips, which are then encapsulated one in each transparent, protective envelope for providing LEDs. Each chip when so encapsulated has its light-emitting surface partly held directly against the envelope. As has been stated in connection with the prior art, the supplementary layer 7 of the chip and the envelope differ in refractive index. Should the light-emitting surface 8 be left unroughened, those of the generated light rays which impinged on the boundary surface between the supplementary layer and the envelope at angles greater than the critical angle determined by their different refractive indices would be totally reflected away from the light-emitting surface and wasted. The present invention provides a new and improved method of roughening the light-emitting surface of the wafer 1 in order to reduce the internal total reflection of the light to a minimum, as hereinbelow described by way of example with reference to FIG. 2.

At (A) in this figure is shown part of the wafer 1, or of its topmost supplementary layer 7, which includes the light-emitting surface 8 to be roughened. Also seen here is a masking film 10 covering the entire light-emitting surface 8 of the wafer 1. The masking film must be of a material that is different from that of the work (in this case, wafer) having the surface to be roughened and that is capable of thermal coagulation into particulate form.

More specifically, silver is currently preferred as the masking material. The masking film 10 may be formed by vacuum vapor deposition, one of the film making methods in general use in semiconductor industry, of silver on the light-emitting surface 8 of the wafer 1. The masking film 10 may be formed to a thickness of about 2-100 nanometers, preferably about 10-30 nanometers. Silver was vacuum deposited to a thickness of 20 nanometers in this particular example of the surface roughening method. The thickness of the masking film 10 depends upon the desired size of the particles to be made, that is, upon the desired roughness or fineness of the light-emitting surface 8. However, should the masking film 10 be more than about 100 nanometers thick, the resulting particles might not be discrete but might unite reticulately with one another. If the masking film 10 were less than about two nanometers thick, on the other hand, then it might not coagulate into particulate form.

Silver is desirable as the masking material because it is easy to coagulate into particles of convenient size and, moreover, resists etching in a subsequent step of this surface roughening method. Alternatives do exist, however, such as silver-base alloy, aluminum, copper, gold, alloys of these metals, mixtures of metals and organic or inorganic substances, or other organic or inorganic etching-resisting masking materials. Furthermore, as required, any such masking material may be admixed with a coagulation accelerator. It is also possible to create the masking film 10 by various other known methods such as sputtering, electron beam evaporation, and coating.

The wafer 1 was held at room temperature during the creation of the masking film 10 by vacuum vapor deposition of silver. Broadly, however, the work may be held anywhere from room temperature (e.g., 20° C.) to 150° C. It is also possible to deposit the masking film 10 on the work at a temperature sufficiently high (e.g., 150-500° C.) to cause an immediate coagulation of the film being formed. That is to say that, in a broader aspect of this invention, the deposition of the masking material and the coagulation thereof into particulate form may be either successive or concurrent.

Next came the separate step, in this example of the inventive method, of thermally coagulating the masking film 10 on the wafer 1. Placed in a heating furnace of the make familiar to those in semiconductor industry, the wafer 1 with the masking film 10 thereon was heated to 300° C. in the atmosphere. The masking film 10 thus coagulated into discrete particles pictured at 11 at (B) in FIG. 2. Generally, silver will coagulate when heated to a temperature range of 250-350° C. The temperature for causing coagulation differs from one masking material to another but will mostly fall in a range of 150-500° C. The masking film of any such material may be heated for 5-30 minutes for coagulation. The coagulation of silver will be ordinarily complete in 15 minutes or so.

Figure 3:
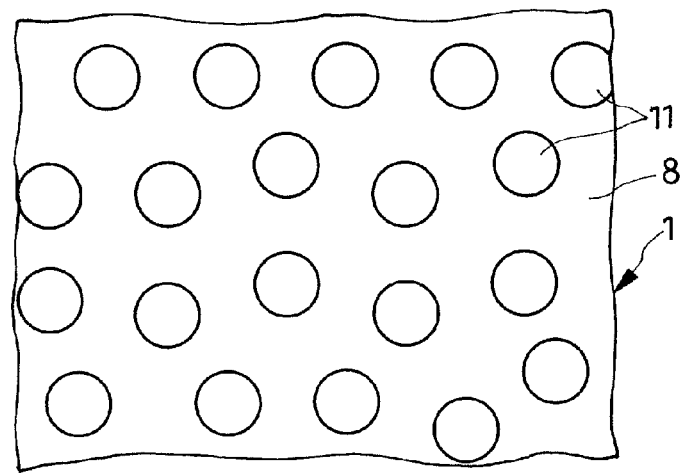
FIG. 3 is a plan view showing step (B) of FIG. 2 as seen from above the LED wafer being surface roughened.

As seen from above the wafer 1, the silver particles 11 created as above on its light-emitting surface 8 will look more or less like the diagrammatic showing of FIG. 3. Actually, the silver particles 11 lay dispersed irregularly or randomly on the light-emitting surface 8. Furthermore, despite the showing of this figure, the silver particles were indefinite in shape and size.

Generally, the particles created by thermal coagulation of the masking film vary in size in proportion with the film thickness. Made from the 20 nanometers thick silver film in this example of the inventive method, the particles ranged in diameter from 50 nanometers to 200 nanometers, averaging approximately 130 nanometers. When made more than 50 nanometers thick, the silver film on subsequent heating did not coagulate into discrete particles; instead, the particles partially joined to one another. Further, when made more than 100 nanometers thick, the silver film on subsequent heating coagulated reticulately, totally failing to provide particles capable of serving as a mask for the purposes of the invention. Therefore, as has been stated, the masking film 10 should be about 2-100 nanometers thick.

The number of the silver particles 11, formed as above from the 20 nanometers thick masking film 10, ranged from four to fifteen per square micrometer of the light-emitting wafer surface 8. The number of the silver particles 11 per unit area of the wafer surface 8 was in inverse proportion with the thickness of the masking film 10 from which they had been made. The distribution of the silver particles 11 over the wafer surface 8 was not exactly uniform but fairly so, wholly satisfactory for their use as an etch mask required for roughening the light-emitting wafer surface by the method of the instant invention.

Using the silver particles 11 as a mask, the light-emitting surface 8 of the semiconducting nitride wafer 1 was then dry-etched by exposure to a stream of chlorine gas ($Cl_2$) as an etchant for 10-30 minutes. The silver particles 11 resisted this etchant, but those parts of the wafer surface 8 which were left unmasked by the silver particles were etched, with consequent creation of pits 12, seen at (C) in FIG. 2, in the wafer surface.

Figure 2:
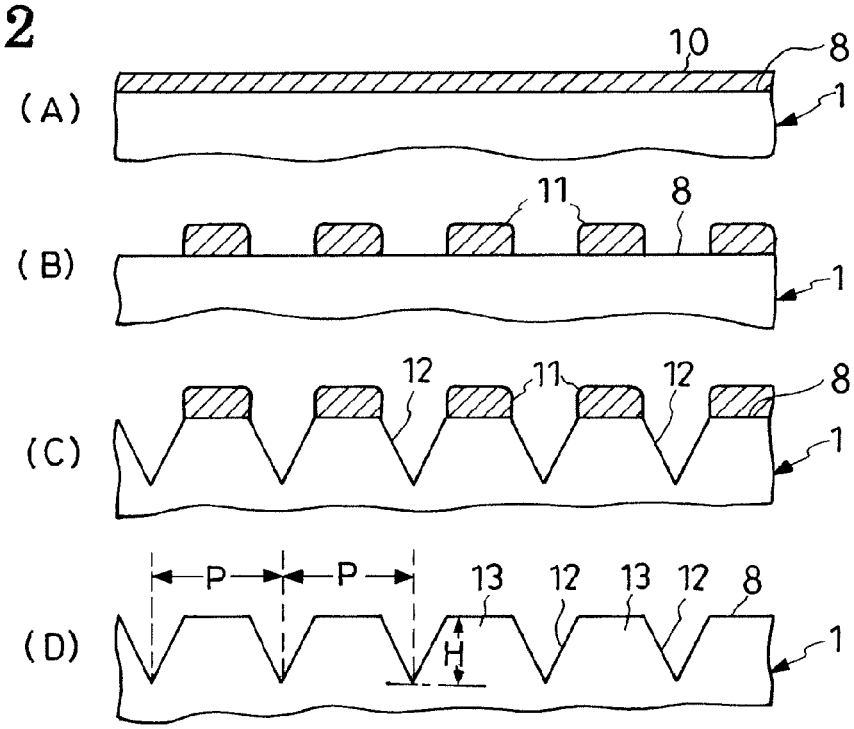
FIG. 2, consisting of (A) through (D), is a series of sectional drawings explanatory of the sequential steps of roughening the surface of the LED wafer of FIG. 1 by the method of the invention.

It might seem from a comparison of (B) and (C) in FIG. 2 that the silver particles 11 were of the same shape and size before and after the dry etching, remaining totally unaffected by the chlorine gas. Actually, however, the silver particles 11 were themselves attacked by the chlorine gas, but to a lesser degree than was the wafer surface 8. The deformations of the silver particles during the etching were indeed such that they gave no ill effects to the roughening of the wafer surface 8. There were even cases in which the deformations of the silver particles favorably affected the roughening of the wafer surface.

Then the silver particles 11 were removed from the roughened wafer surface 8 by etching with an aqueous solution of hydrogen chloride (HCl) for two minutes at room temperature. Some other etchant could have been used for this purpose, such for example as an admixture of ammonium hydroxide ($NH_4OH$), hydrogen peroxide ($H_2O_2$) and water.

At (D) in FIG. 2 is depicted the thus-obtained wafer 1 having its light-emitting surface 8 roughened with pits 12 and projections 13 for prevention of internal total reflection. The pitch P, or center-to-center distance, of the pits 12 was in the range of about 50-800 nanometers. The depth H of the pits 12 was in the range of 50-1500 nanometers. The pitch P and depth H of these ranges both proved favorable for the purpose for which they are intended. A preferred range of the pitch P is about 100-300 nanometers. For most effective prevention of internal total reflection, the pitch P should be of the order of a fraction of, and at most equal to, the wavelength of the light to be generated at the active layer 5, FIG. 1, of the LED.

Figure 4:
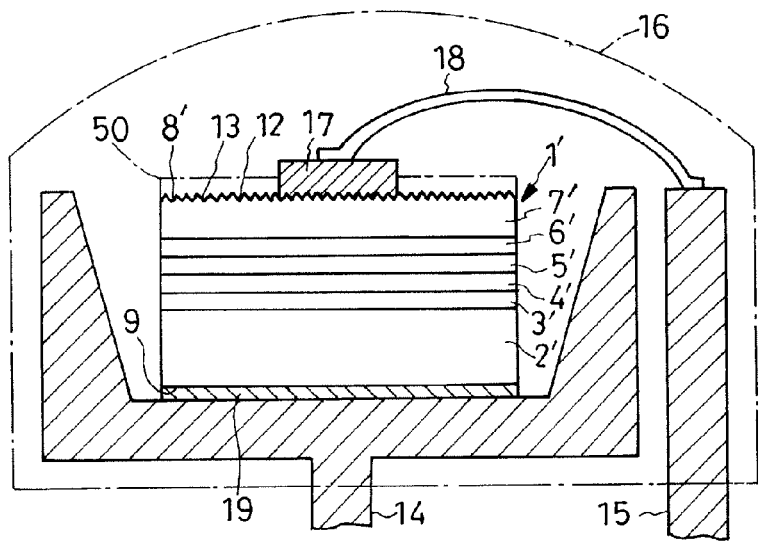
FIG. 4 is a sectional view of an LED having a chip with a light-emitting surface roughened by the method of the invention.

The roughening of the light-emitting surface 8 of the wafer 1 having been completed, the wafer 1 was then conventionally electroded and diced into LED chips designated 1' in FIG. 4. This figure further shows the LED chip 1' electrically coupled to a pair of terminals 14 and 15 and encapsulated in a transparent protective envelope 16 which consists of plastic material to complete an LED. A more detailed description of the thus-completed LED follows.

The LED chip 1' is a lamination of a substrate 2', buffer 3', n-type lower cladding 4', active layer 5', p-type upper cladding 6', and supplementary layer 7', corresponding respectively to the substrate 2, buffer 3, lower cladding 4, active layer 5, upper cladding 6, and supplementary layer 7. The light-emitting surface 8' of the LED chip 1' has been roughened as above with the pits 12 and projections 13 by the method of this invention. The anode 17 is formed centrally on this light-emitting surface 8' and wired at 18 to the terminal 15. The other major surface 9 of the LED chip 1' is wholly covered with the cathode 19, which is affixed to the terminal 14 via a layer, not shown, of an electroconductive bonding agent. Indicated by a phantom outline, the protective plastic envelope 16 encloses all of the LED chip 1' and electrodes 17 and 19 and parts of the terminals 14 and 15, contacting that part of the roughened light-emitting surface 8' of the LED chip 1' which is left exposed by the anode 17. The refractive index of the protective envelope 16 is 1.5 or so, less than that (e.g., 3.1-3.5) of the LED chip 1'.

The specific example of the particulate mask surface-roughening method according to the invention, set forth in detail hereinabove, offers the following advantages over the prior art studied earlier herein:

1. The light-emitting surface of the LED wafer 1, and hence of the LED chips 1', can be finely roughened using a mask that need not be precision machined or etched into any predefined shape. All that is needed for obtaining such a mask is to cover the entire surface 8 of the wafer 1 with the masking film 10 of silver with a film-forming apparatus in prevalent use among semiconductor manufacturers and to heat the film for coagulation into the particles 11 in a furnace which also is in widespread use in the industry. The particulate mask according to the invention is far easier and far less expensive of fabrication than the comparable ones used heretofore for surface roughening purposes.

2. The size of the particles 11 is controllable in terms of the thickness of the masking film 10 from which they are made.

3. The size of the particles 11 being in proportion with the thickness of the masking film 10, the surface may be roughened to a desired degree of fineness through control of the film thickness.

4. The pits 12 and projections 13 are subject to change in shape and size depending on how the surface is dry-etched through the particulate mask. The parameters of the dry etching and the particulate mask may therefore be appropriately determined and combined for roughening the surface in a desired manner.

5. With the light-emitting surfaces of their chips roughened with pits and projections with a pitch of tens or hundreds of nanometers by the method of this invention, the LEDs of the FIG. 4 construction were approximately three times as bright as those of the same construction except that the light-emitting surfaces of their chips were unroughened. LEDs of like construction having their light-emitting surfaces treated by the prior art photolithographic method into a roughness with a pitch of several micrometers were 1.8 times as bright as their unroughened counterparts. It has thus proved that the particulate mask surface-roughening method of the instant invention is significantly more conducive to the enhancement of LED efficiency than the known photolithographic method.

Alternate Surface-Roughening Method

The surfaces of some semiconductor wafers may be of such materials that the masking film will not easily coagulate into particles thereon. The particulate mask surface-roughening method according to the invention needs some slight modification in such cases.

Figure 5:
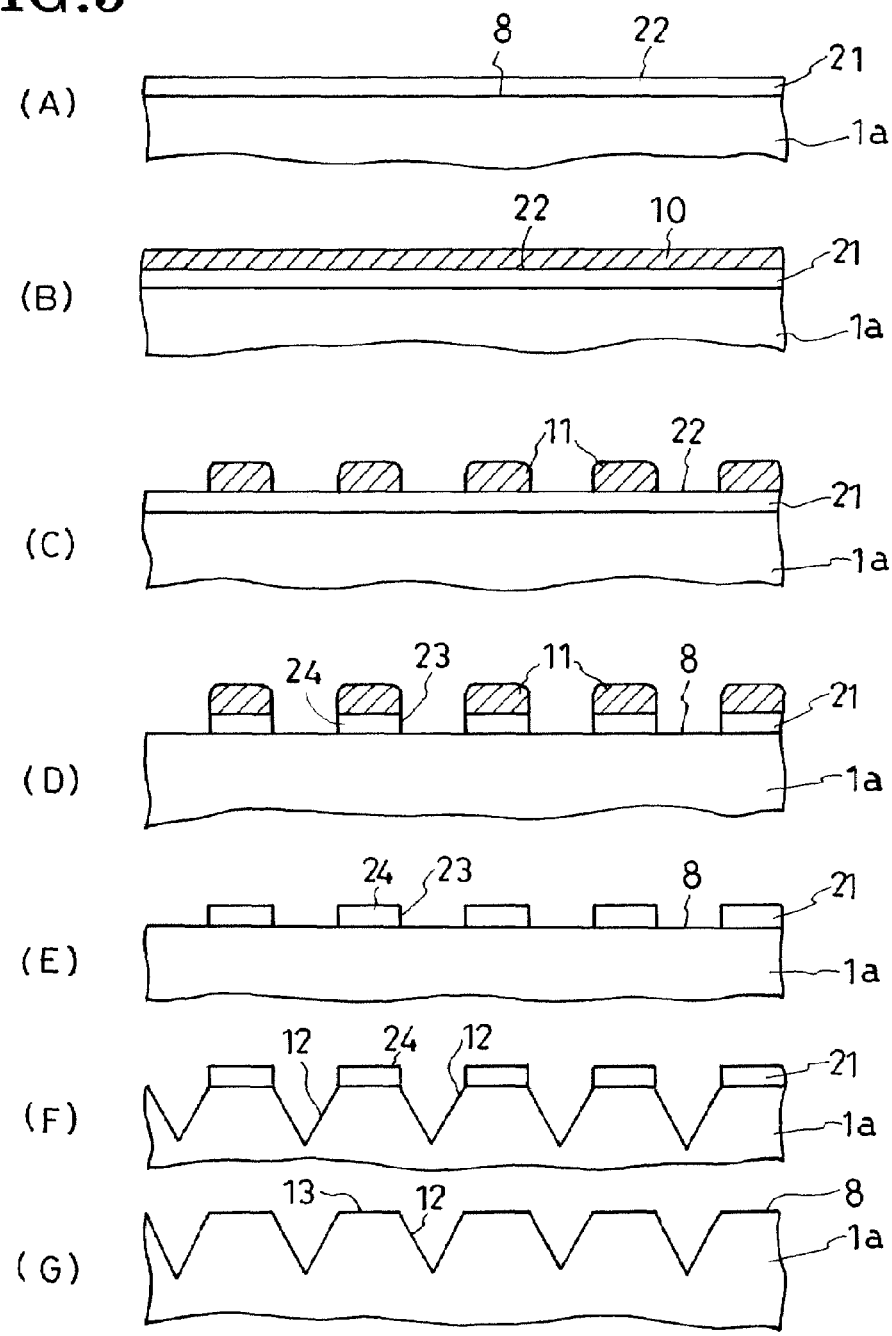
FIG. 5, consisting of (A) through (G), is a series of sectional drawings explanatory of the sequential steps of roughening the surface of an LED wafer by an alternative method of the invention.

At (A) in FIG. 5 is shown a semiconductor wafer $1_a$ having the light-emitting surface 8 to be roughened. This wafer $1_a$ is constituted of layers that are not indicated because of its constructional and functional similarly to those of its FIG. 1 counterpart 1. However, the constituent layers of the wafer $1_a$ are made from different materials from those of the corresponding layers of the wafer 1. Specifically, the wafer $1_a$ has a substrate of n-doped gallium arsenide (GaAs), a buffer of n-doped GaAs, a lower cladding of n-doped aluminum gallium indium phosphide (AlGaInP), an active layer of undoped AlGaInP, an upper cladding of p-doped AlGaInP, and a supplementary layer of p-doped AlGaInP.

Defining the light-emitting surface 8 to be roughened, the topmost p-AlGaInP supplementary layer of the wafer $1_a$, makes it difficult for the silver masking film to coagulate into discrete particles, should this film be formed directly thereon. Hence the alternative particulate mask surface-roughening method to be set forth hereinbelow. It will therefore be apparent that the above specified materials for the constituent layers of the wafer $1_a$ should not be taken in a limitative sense; indeed, the wafer layers could be of other semiconducting compounds or even the same as those employed for the FIG. 1 wafer 1.

As indicated at (A) in FIG. 5, the alternative surface-roughening method starts with the creation of a coagulation accelerator film 21 on the light-emitting surface 8 of the wafer $1_a$. As the name implies, the coagulation accelerator film 21 is of a material that expedites the coagulation of silver or other masking material into particulate form. An example is silicon oxide ($SiO_2$), which may be filmed on the wafer surface 8 as by sputtering. Being itself to be subsequently etched into a mask through which the wafer surface 8 is to be etched and roughened, the coagulation accelerator film 21 must be thick enough (e.g., 10-2000 nanometers) to permit use as mask.

The next step, illustrated at (B) in FIG. 5, is the fabrication of a masking film 10 on the surface 22 of the coagulation accelerator film 21. The masking film 10 may be formed just as it was formed directly on the light-emitting surface 8 of the wafer 1 at (A) in FIG. 2.

Then the work may be heated to a temperature sufficiently high to cause coagulation of the masking film 10 on the coagulation accelerator film 21 into particles 11 as at (C) in FIG. 5, thereby exposing part of the surface 22 of the underlying coagulation accelerator film. The masking film 10 will readily coagulate into the discrete particles 11 thanks to the silicon oxide coagulation accelerator film 21 on which it is formed.

Then, using the particles 11 as a mask, the coagulation accelerator film 21 may be dry etched with a fluoride gas such as fluoroform ($CHF_3$). The coagulation accelerator film 21 on being etched through the particulate mask will have interstices 23, shown at (D) in FIG. 5, formed therein. The interstices 23 will extend throughout the coagulation accelerator film 21 and so expose part of the light-emitting surface 8 of the wafer $1_a$. The reference numeral 24 in this figure denotes the island-like remains of the coagulation accelerator film 21.

Then the mask of silver particles 11 may be removed using an HCl- or $NH_4OH$-based etchant as in the first disclosed surface-roughening method. The result is indicated at (E) in FIG. 5, which shows the wafer $1_a$ having the light-emitting surface 8 exposed through the island-like remnants 24 of the coagulation accelerator film 21.

A closer study of FIG. 5 (E) will reveal that the objective of roughening the light-emitting surface 8 of the wafer $1_a$ is in a way accomplished here. Optically, the wafer surface 8 has been roughened with the interstices 23 in, and island-like remnants 24 of, the overlying coagulation accelerator film 21. This alternative surface-roughening method may therefore be cut short now.

The following additional steps are needed, however, if the wafer surface 8 is itself to be roughened the same way as illustrated at (D) in FIG. 2. Toward this end, using the island-like remnants 24 of the coagulation accelerator film 21 as a mask, the wafer surface 8 is etched to create pits 12 therein as at (F) in FIG. 5. It is understood that the coagulation accelerator film 21 is made from such a material, and is so thick, that it can sufficiently resist the etchant that attacks the wafer surface 8.

Then, as indicated at (G) in FIG. 5, the island-like remands 24 of the coagulation accelerator film 21 are etched off the wafer surface 8. The wafer surface 8 has now been roughened with the pits 12 and projections 13 as in the first disclosed example of the particulate mask surface-roughening method according to the invention.

This alternative surface-roughening method gains the same benefits as does the first disclosed one as the coagulation of a silver masking film is here again relied upon, though in a slightly different way, for masking and roughening the work. It is additionally made clear that even the surface of a wafer that impedes silver coagulation can be roughened by the particulate mask method of this invention by use of a coagulation accelerator film of silicon oxide or the like.

Second Alternate Surface-Roughening Method

Figure 6:
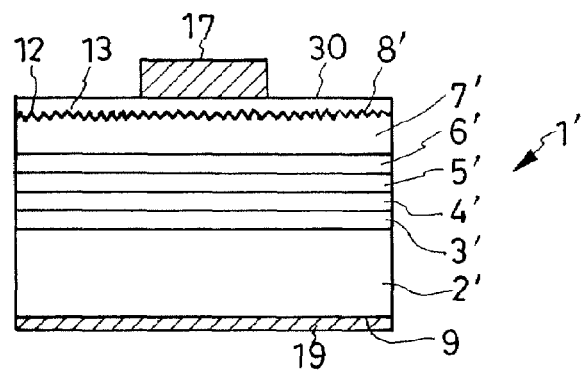
FIG. 6 is a sectional view of another LED chip having a light-emitting surface roughened according to the invention.

The LED chip shown in FIG. 6 and therein generally designated 1' is akin to that seen in FIG. 4 except that a current-spreading film 30 of optically transparent, electrically conducting material overlies the light-emitting chip surface 8' which has been roughened by the method of this invention. Itself well known in the art, the current-spreading film 30 is usually made from indium tin oxide (ITO) and electrically connected to both chip 1' and anode 17 to serve the purpose of making the outer parts of the chip as high in current density as the its central part underlying the anode.

It is understood that this chip 1' is enclosed in a plastic envelope similar to that indicated at 16 in FIG. 4. The current-spreading film 30 is so thin that the internal total reflection of the light would occur in the encapsulated LED would occur notwithstanding the presence absence of the current-spreading film if the light-emitting surface of the chip were not roughened. Such reflection is greatly curtailed in this type of LED, too, by roughening the light-emitting chip surface as taught by the invention.

Third Alternate Surface-Roughening Method

Figure 7:
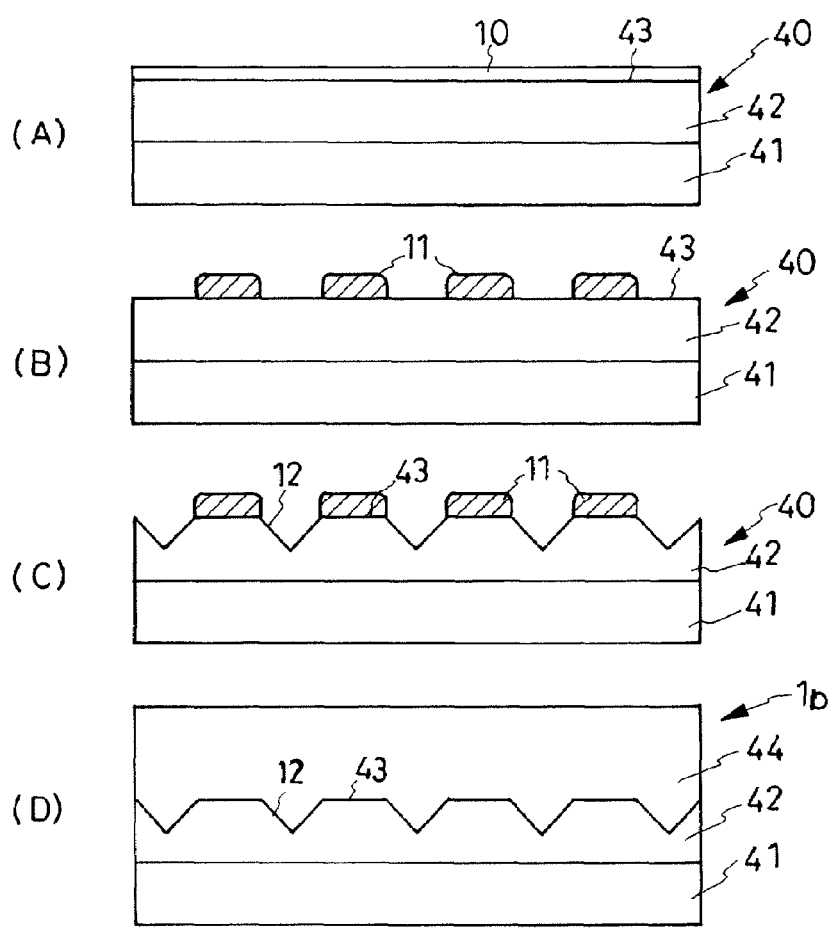
FIG. 7, consisting of (A) through (D), is a series of sectional drawings explanatory of the sequential steps of fabricating a semiconductor wafer, in which the surface-roughening method of the invention is utilized for creation of a low-dislocation-density semiconductor layer by MCE.

The surface-roughening method of this invention is shown in FIG. 7 as applied to the fabrication of a low-dislocation-density, high-crystallinity nitride semiconductor layer by aforesaid MCE. The fabrication of such a layer requires the creation of pits in the surface of an underlying layer.

At (A) in FIG. 7 is shown the work 40 in this application, which includes a GaN buffer 42 on a substrate 41 of silicon or the like. It is the surface 43 of the buffer 42 which is to be roughened. Therefore, as indicated also at (A) in FIG. 7, a silver masking film 10 is formed on this buffer surface 43 by vacuum vapor deposition or any other known or suitable method.

Then the masking film 10 is heated as in the first described method for coagulation into particulate form. The resulting silver particles are depicted at 11 at (B) in FIG. 7.

Then, using the silver particles 11 as mask, the buffer 42 is dry etched as in the first described method. At (C) in FIG. 7 are shown the pits 12 thus etched in the surface 43 of the buffer 42. Then the silver particles 11 are removed from over the buffer surface 43 as in the first described method.

The next step, illustrated at (D) in FIG. 7, is the epitaxial growth, as by metalorganic vapor phase epitaxy (MOCVD), of a layer 44 of a semiconducting nitride such as GaN on the roughened surface 43 of the buffer 42. As is well known, the semiconducting nitride will grow not only vertically but horizontally too, completely filling the pits 12 in the buffer surface 43 and ultimately creating the flat-surfaced layer 44. The crystal grown bidirectionally is low in dislocation density, and so will be the nitride layer 44 grown as above. The thus-obtained wafer with the low-dislocation-density nitride layer 44 is generally labeled $1_b$.

This third alternate surface-roughening method is advantageous over the conventional photolithographic method in the ease and inexpensiveness with which the pits 12 are formed.

Possible Modifications

Notwithstanding the foregoing detailed disclosure it is not desired that the present invention be limited by the exact showings of the drawings or the description thereof. The following is a brief list of possible modifications, alterations or adaptations of the illustrated representative particulate-mask surface-roughening methods which are all believed to fall within the purview of the claims annexed hereto:

1. As indicated in phantom outline in FIG. 4 and therein designated 50, a phosphor-made wavelength converter layer, itself well known in the LED art, could be formed on the roughened light-emitting surface 8' of the LED chip 1'. The wavelength converter layer 50 would be uniformly excited as the light was dispersed by the roughened light-emitting surface 8'.

2. The surface of the light-spreading film or transparent conducting film 30, FIG. 6, rather than the light-emitting surface 8' of the LED chip 1', could be roughened by the method of this invention. In this case, as indicated by the phantom outline labeled 30a in FIG. 1, the current-spreading film of transparent, electroconductive material such as ITO might be formed on the light-emitting wafer surface 8 without roughening this surface. Then the surface of the current-spreading film $30_a$ might be roughened using a particulate mask obtained by coagulation of a masking film of silver or the like according to the invention.

3. The invention is applicable to semiconductor wafers made from substances other than those specified herein, such as aluminum gallium indium phosphide, aluminum gallium arsenide, gallium phosphide, and zinc oxide.

4. The invention may be utilized for the surface roughening of a variety of work other than semiconductor wafers.

What is claimed is:

1. A surface-roughening method comprising the steps of:
   (a) providing work having a surface to be roughened, the work being of a material capable of etching with a prescribed etchant;
   (b) forming a masking film on the surface of the work, the masking film being of a material capable of coagulation into a particulate form and of resisting the prescribed etchant;
   (c) causing the masking film to coagulate into a particulate mask on the surface of the work; and
   (d) roughening the surface of the work by etching the work with the prescribed etchant through the particulate mask.

2. A surface-roughening method as recited in claim 1, wherein steps (b) and (c) are concurrent.

3. A surface-roughening method as recited in claim 1, wherein the work is made from a semiconductor, and the masking film from a metal.

4. A surface-roughening method comprising the steps of:
   (a) providing work having a surface to be roughened;
   (b) forming a coagulation accelerator film on the surface of the work, the coagulation accelerator film being of a material capable of etching with a prescribed etchant;
   (c) forming a masking film on the coagulation accelerator film, the masking film being of a material capable of coagulation into a particulate form and of resisting the prescribed etchant;

(d) causing the masking film to coagulate into a particulate mask on the coagulation accelerator film;

(e) roughening the surface of the work by etching the coagulation accelerator film through the particulate mask; and (f) removing the particulate mask.

5. A surface-roughening method as recited in claim 4, wherein steps (c) and (d) are concurrent.

6. A surface-roughening method as recited in claim 4, wherein the work is made from a semiconductor, and the coagulation accelerator film from silicon oxide.

7. A surface-roughening method as recited in claim 4, wherein the coagulation accelerator film on being etched through the particulate mask has island-like remnants left on the surface of the work, wherein the work is of a material capable of etching with a second prescribed etchant, wherein the coagulation accelerator film is capable of resisting the second prescribed etchant, and wherein the method further comprises the steps of:

(a) etching the surface of the work with the second prescribed etchant through the island-like remnants of the coagulation accelerator film; and (b) removing the island-like remnants of the coagulation accelerator film from over the surface of the work.

8. A surface-roughening method for use in fabrication of a low-dislocation-density semiconductor layer by microchannel epitaxy, which method comprises the steps of:

(a) providing a substrate having a surface to be roughened;

(b) forming a masking film on the surface of the substrate, the masking film being of a material capable of coagulation into a particulate form;

(c) causing the masking film to coagulate into a particulate mask on the surface of the substrate;

(d) roughening the surface of the substrate by etching the same through the particulate mask;

(e) removing the particulate mask from over the surface of the substrate; and (f) epitaxially growing a semiconductor layer on the roughened surface of the substrate.

* * * * *